(12) United States Patent
Hill

(10) Patent No.: US 6,236,240 B1
(45) Date of Patent: May 22, 2001

(54) HOLD-TIME LATCH MECHANISM COMPATIBLE WITH SINGLE-RAIL TO DUAL-RAIL CONVERSION

(75) Inventor: Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,070

(22) Filed: Dec. 15, 1999

Related U.S. Application Data

(60) Provisional application No. 60/117,745, filed on Jan. 29, 1999.

(51) Int. Cl.[7] ............................................. H03K 19/096
(52) U.S. Cl. .............................. 326/98; 326/112; 326/121
(58) Field of Search .................................. 326/112, 119, 326/121, 93, 95, 98

(56) References Cited

U.S. PATENT DOCUMENTS

| | | | |
|---|---|---|---|
| 4,668,880 | * 5/1987 | Shoji | 326/121 |
| 4,851,714 | * 7/1989 | Hwang | 326/121 |
| 5,208,489 | * 5/1993 | Houston | 326/95 |
| 6,124,735 | * 9/2000 | Blomgren et al. | 326/121 |

* cited by examiner

*Primary Examiner*—Michael Tokar
*Assistant Examiner*—Don Phu Le
(74) *Attorney, Agent, or Firm*—Robert D. Marshall, Jr.; W. James Brady, III; Frederick J. Telecky, Jr.

(57) ABSTRACT

A single-rail input to dual-rail output conversion circuit suitable for a domino logic hold-time latch. The conversion circuit integrates the two circuit functions in the same circuit block. The circuit involves minimal circuit complexity including a single additional transistor. This circuit eliminates a problem of false output of the prior art.

10 Claims, 9 Drawing Sheets

HOLD-TIME LATCH MECHANISM COMPATIBLE WITH SINGLE-RAIL TO DUAL-RAIL CONVERSION

This application claims priority under 35 USC §119(e)(1) of Provisional Application Number 60/117,745, filed Jan. 29, 1999.

TECHNICAL FIELD OF THE INVENTION

The technical field of this invention is logic circuits and more particularly hold-time latching in single-rail to dual-rail conversion dynamic logic circuits.

BACKGROUND OF THE INVENTION

Conventional dynamic logic provides excellent opportunities for significant performance improvement. Such dynamic logic often entails a number of special requirements which often can be met only at the expense of additional circuit complexity. This circuit complexity occasionally includes the expense of burdensome duplication of circuitry not ordinarily needed in logically equivalent static logic designs. For example, domino logic is the conventional form of dynamic logic being used in current dynamic logic designs. In domino logic, the implementation of non-unate logic, such as XOR logic, requires dual-rail signals. Such dual-rail signals clearly entail the generation of the often otherwise unavailable phase of the signal or signals. Because XOR gates are a reasonably common occurrence, the generation of dual-rail versions of signals is a frequent requirement and this is a more complex circuit function than the simple inversion used in static logic.

Other restrictions and drawbacks are encountered when a hold-time latch is required. Hold-time is defined as the amount of time for which a data signal must remain valid after the active clock edge has occurred or after the active clock time interval has begun for the case of dynamic logic, in order to obtain a valid logical result. In contrast to the register-based logic of static designs, domino logic uses a latch-based approach. A hold-time latch is commonly integrated into the consuming or receiving gate for best performance and circuit economy. This gives rise to special circuit considerations which must be considered to make the circuit function implementation successful.

SUMMARY OF THE INVENTION

The unique circuit of this invention provides a means of integrating two circuit functions in the same circuit block. These two circuit functions are hold-time latching and from single-rail logic signals to dual-rail logic signals. Moreover the circuit accomplishes this with minimal circuit complexity and provides high performance and reliable functionality. Because hold-time latching and conversion from single-rail to dual-rail are frequently recurring needs in domino logic, the circuit configuration of this invention will be widely used and will have a significant impact on future designs.

BRIEF DESCRIPTION OF THE DRAWINGS

These and other aspects of this invention are illustrated in the drawings, in which.

PRIOR ART

Figure 1:
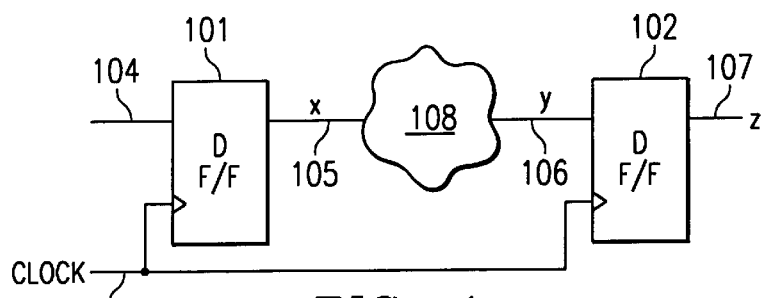
FIG. 1 illustrates a register-based design of conventional static logic.
Figure 2:
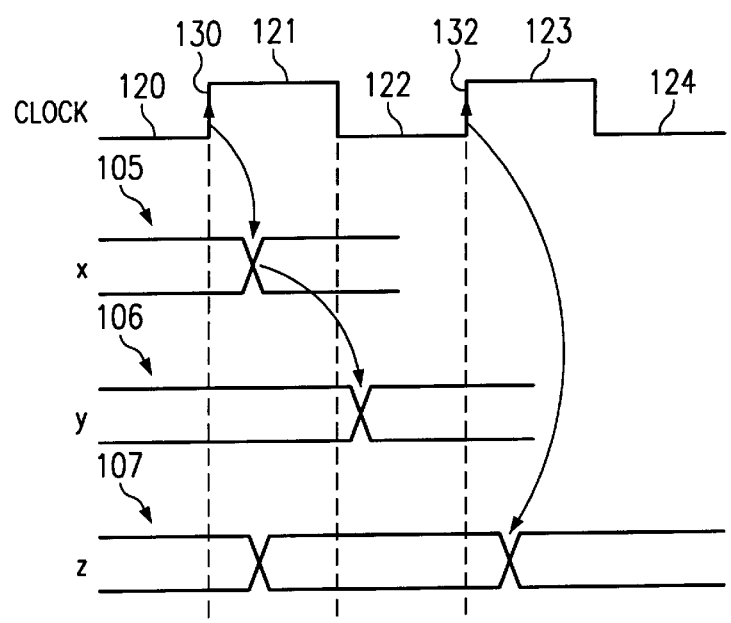
FIG. 2 illustrates the timing of the circuit illustrated in FIG. 1.

FIG. 1 illustrates a conventional register-based design. The design of FIG. 1 almost inherently obeys the timing requirement with regard to hold time. Typical edge-triggered D-flip flops have near-zero hold-time and, as long as clock skew (variation of time of occurrence of the active clock edge throughout the logic function) is controlled, there is virtually no danger of false data being transferred because of hold-time considerations. For the circuit of FIG. 1, FIG. 2 illustrates the clock signal 103 triggering on its positive-going edge 120, and the latching of D flip-flops 101 and 102 taking place simultaneously and synchronously. The logic block 108 (FIG. 1), has virtually the entire time interval 121 plus 122 minus only a small set-up time to receive the input "X" at node 105 and develop a steady output "Y" at node 106 before the next positive clock edge 123 triggers the latching action of D flip-flop 102, and produces the "Z" output at node 107.

Figure 3:
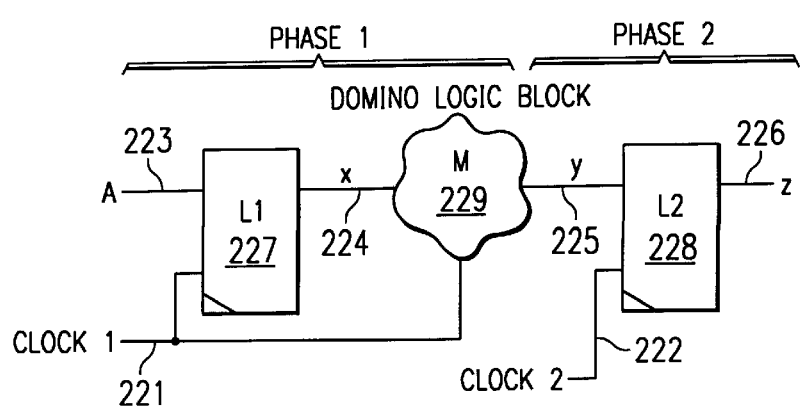
FIG. 3 illustrates a conventional domino logic latch-based design having a domino logic block and a driving and a consuming static hold-time latch.
Figure 4:
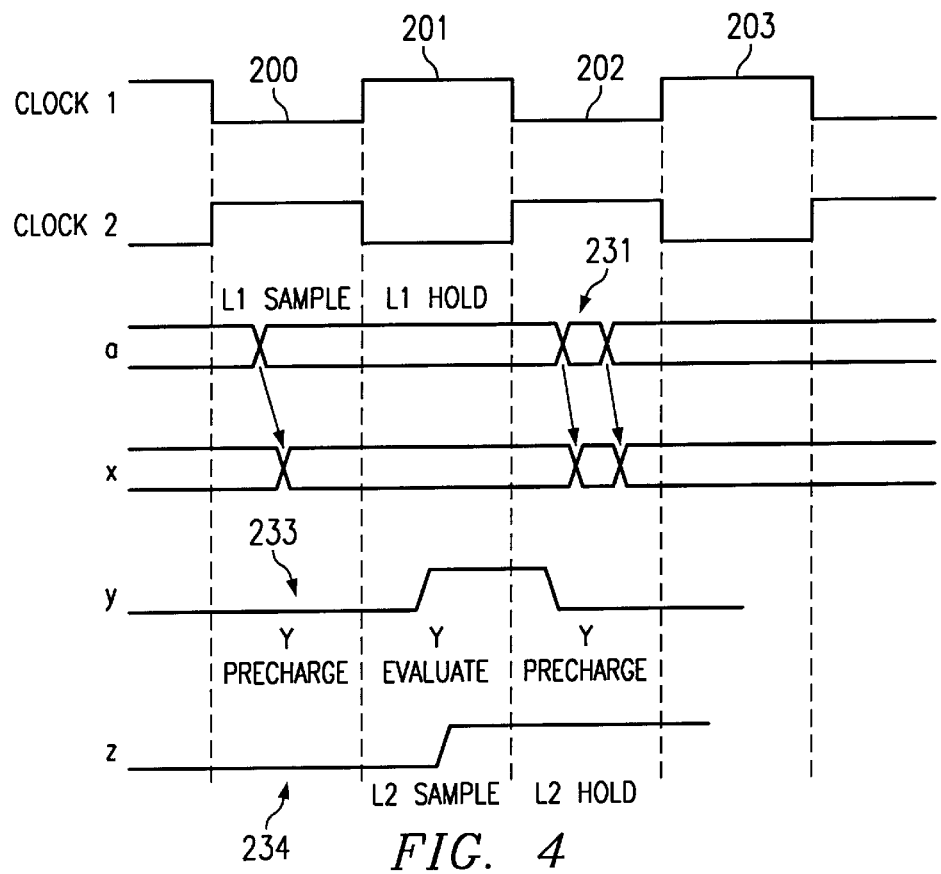
FIG. 4 illustrates the timing of the circuit illustrated in FIG. 3.

FIG. 3 illustrates a conventional latch-based design of domino logic. The design of FIG. 3, in contrast to that of FIG. 1, uses both clock phases. FIG. 4 illustrates that static logic latch 227 samples during the clock interval 200, and is in a hold condition during clock interval 201. The static logic latch 228 samples during clock interval 201 and holds during clock interval 202. During the time interval 202, latch 227 is transparent and any change in "A" will be reflected at "X".

The design of FIG. 3 must meet the circuit restrictions of the M circuit block. This M circuit block requires that input gates be of class I (see FIG. 5) and gates which follow may be of class I or class II (see FIG. 6). The timing illustrated in FIG. 4, shows latch 227 is the sending element and 228 is the consuming or receiving element. The M circuit block 229 precharges during the time interval 200 as 227 samples. The M circuit block 229 evaluates during time interval 201. The hold-time latch 228 holds the logical result during the time interval 202 producing the valid condition for the output signal "Z" 226.

Figure 5:
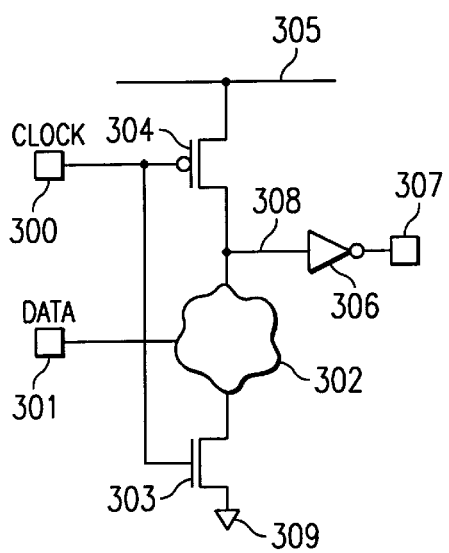
FIG. 5 illustrates a class I or footed domino logic gate.
Figure 6:
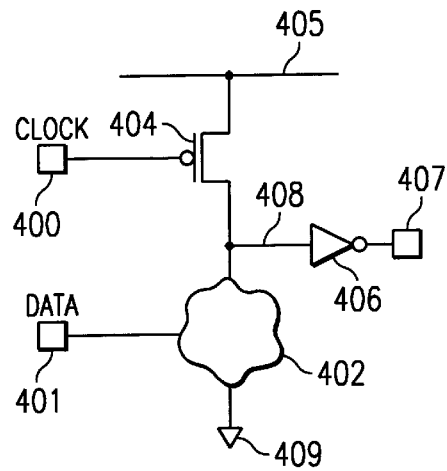
FIG. 6 illustrates a class II or footless domino logic gate.

FIG. 5 illustrates the circuit configuration of class I gates, which are also referred to as footed domino gates. Multiple single rail inputs are applied at node 301. The logic circuit block 302 is the dynamic logic implementation of the logic. Clock signal 300 drives transistors 303 and 304 initiates precharge action when clock 300 is "low" and evaluate action when clock 300 is "high". In any domino logic block of several stages of logic, all input (first stage) logic must be of this class I type. Subsequent stages may be of this class I type or may be class II type FIG. 6 illustrates the circuit configuration of class II gates are also referred to as footless domino gates. The class II circuit eliminates the foot, which is clocked transistor 303 of FIG. 5. Class II circuits cannot be used as in input stages of the logic circuit block such as M circuit block 229 in FIG. 3. This requirement arises from the fact that the input signals to the first stage of the logic circuit block may be high for a large portion of the clock period during which this gate should precharge. On the other hand, when driven from a class I gate as the input stage a class II gate will function properly under all conditions.

The particular delay and precharge requirements of these special gates must be considered for the successful design of domino logic. There is an additional need to properly deal with the additional considerations that the hold-time requirement places on the overall circuit. Even further considerations must be met when conversion from single-rail to dual-rail logic is included.

Figure 7:
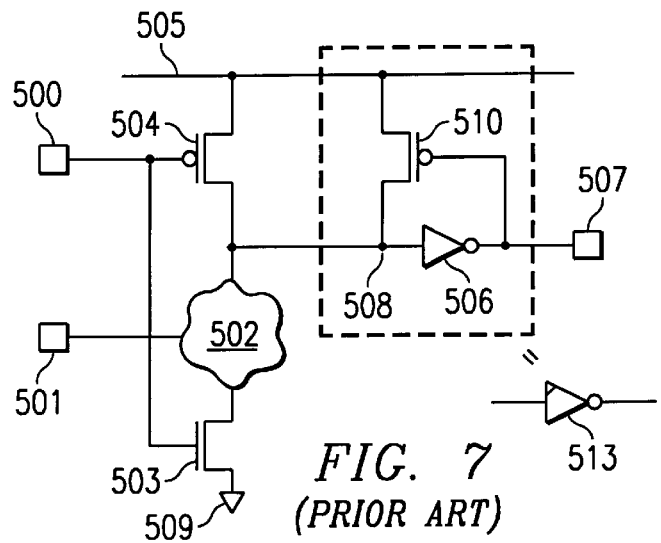
FIG. 7 illustrates a class I domino logic gate with a p-keeper latching element.

FIG. 7 illustrates building a latching action into class I gates using a p-keeper transistor 510. As in the previous circuits, a clock input is applied at node 500 and multiple single rail logic inputs are applied at node 501. When the output node 507 precharges "low" transistor 510 turns on and acts to hold node 508 "high" and output node 507 "low" even if node 508 is perturbed by noise tending to pull 508 "low". This is often described as a "soft latching action." When logic circuit block 502 enters the evaluate phase (clock "high"), it is well able to pull node 508 "low." This enters new data despite the "soft latching action" of transistor 510. Gate 513 in FIG. 7 illustrates the symbol for a gate 506 having p-keeper action. Gate symbol 513 denotes the components inside the dashed box of FIG. 7.

Figure 8:
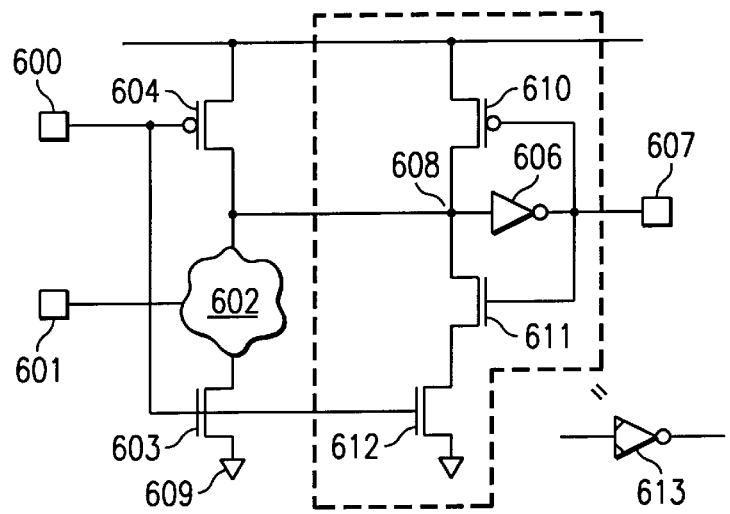
FIG. 8 illustrates a class I domino logic gate with both n-keeper and p-keeper latching elements.

FIG. 8 illustrates a more robust form of latching action implemented through the use of n-keeper action in addition to the p-keeper action. As in the previous circuits, clock input is applied at node 600 and multiple single-rail logic inputs are applied at node 601. In FIG. 8, transistors 611 and 612 are added to the corresponding circuit of FIG. 7. These n-keeper transistors 611 and 612 complete the latching action by feeding back the output signal 607 to the node 608 by means of the action of a full CMOS gate formed from transistors 610 and 611. This action is gated "on" when clock is "high" by turning "on" transistor 612 when clock is "high". These p-keeper and n-keeper structures are described in U.S. Pat. No. 5,815,005 issued Sep. 9, 1998 and entitled "POWER REDUCTION CIRCUITS AND SYSTEMS FOR DYNAMIC LOGIC GATES" and assigned to Texas Instruments, the assignee of this application. The symbol for a gate 606 having both p-keeper and n-keeper action is illustrated in FIG. 8 by gate 613. Gate symbol 613 denotes the components inside the dashed box of FIG. 8.

Figure 9:
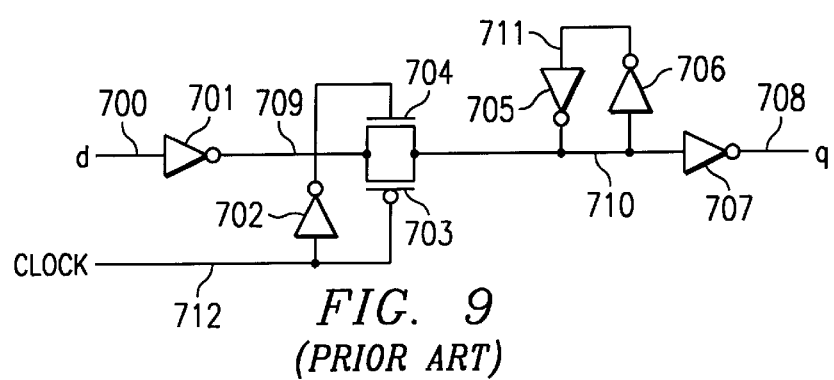
FIG. 9 illustrates a conventional static latch which can also be used at specific locations in domino logic designs where latching may be necessary.
Figure 10:
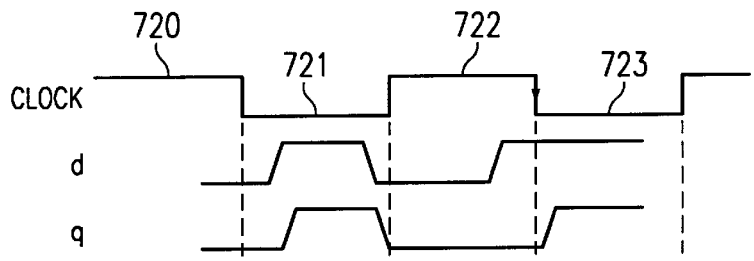
FIG. 10 illustrates the timing of the circuit illustrated in FIG. 9.

Alternately, the latching function in domino logic could be implemented through the use of conventional static transparent latches placed wherever in the logic path the latching function is needed. This option would use a static latch such as the circuit configuration of FIG. 9. This latch is well behaved and FIG. 10 illustrates its timing. During clock interval 721 (clock is "low"), the transmission gate formed from transistors 703 and 704 is "on" and node q 708 follows node d 700. The latch is in a transparent or evaluate mode. During clock interval 722, clock is "high" and signal "q" at node 708 is latched and does not respond to a transition on signal "d" at node 700, shown in clock interval 722, as a "low" to "high" transition in "d". This static latch is considerably more complex than the circuits of FIGS. 7 and 8 but provides greater noise immunity. Generally, domino logic latches with single-rail input and single-rail output can be implemented in a straightforward fashion. However, when dual-rail output latches must be implemented, the only approach in prior art has been to have dual-rail inputs. Even in the case of simple inversion, where the design requirement is to take a single-rail signal and merely convert it to a latched dual-rail output signal, the latch required is complex because both rails of the signal being inverted must be supplied to the dual-rail latch, rather than by a simple inversion within the dual-rail latch functional block.

Figure 11:
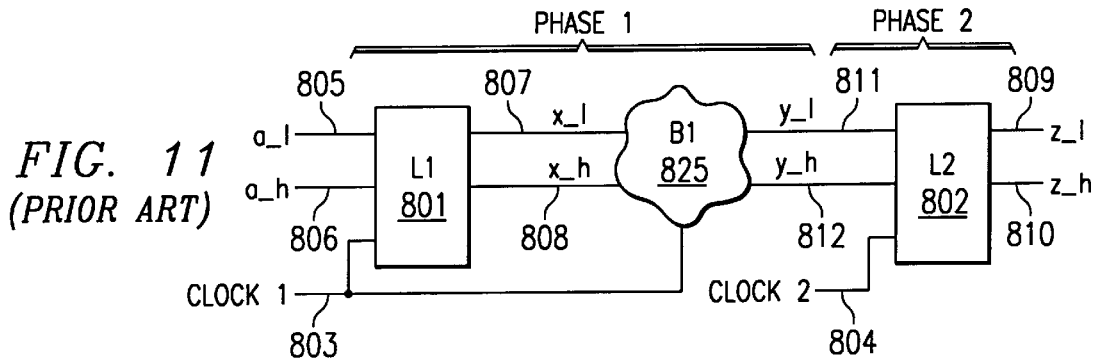
FIG. 11 illustrates a conventional dual-rail domino logic latch driving another conventional dual-rail domino logic latch with timing diagrams included.
Figure 12:
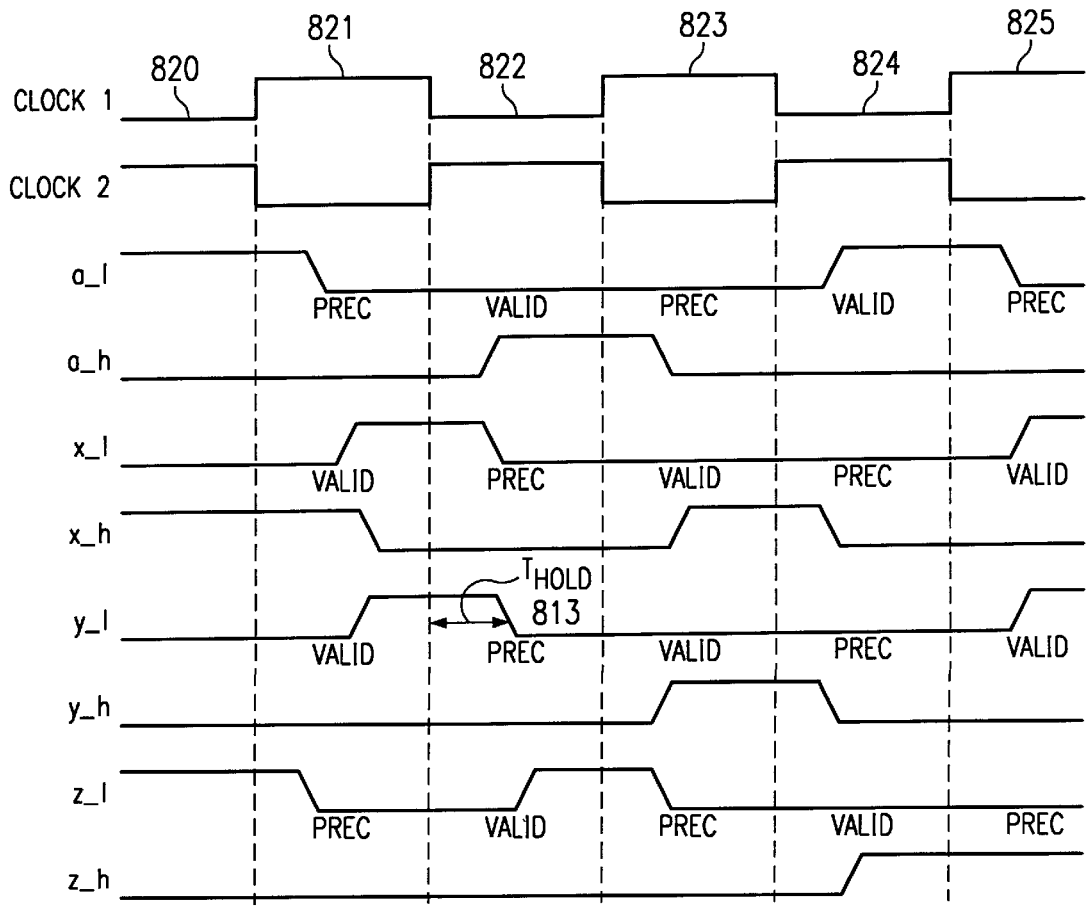
FIG. 12 illustrates the timing of the circuit illustrated in FIG. 10.

FIG. 11 illustrates the conventional dual-rail latch. FIG. 12 illustrates the corresponding timing. During clock interval 821, blocks L1 and B1 evaluate and L2 precharges. The signal z_h at node 810 and its dual-rail counterpart z_l at node 809, both precharge "low" while phase 1 is evaluating. Signal y_h becomes equal to x_h. Signals x_l and y_l are in corresponding opposite logic states as shown in FIG. 12. During the next time interval 822, phase 2 evaluates. This results in signal z_l going "high" and signal z_h remaining "low". The requirement that y_h or y_l must remain valid during clock interval 822 for a time $t_{hold}$ 813 for z_l and z_h to evaluate correctly defines the needed hold-time. The latch 802 will be able to evaluate y_l and y_h correctly if y_l and y_h holds a valid state for at least the time $t_{hold}$ during the phase 2 evaluation period 822.

Figure 13:
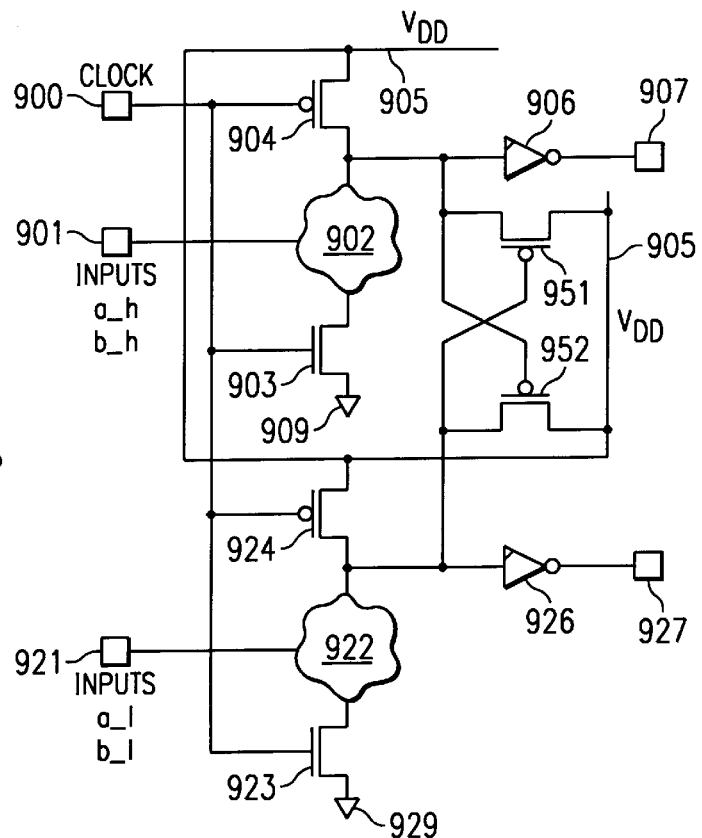
FIG. 13 illustrates the conventional transistor level schematic of the latches of FIG. 8.

FIG. 13 illustrates the transistor and gate level schematic of the circuitry within each of the dual-rail latches 801 and 802. Correct logic behavior requires logic blocks 902 and 922 to perform complementary functions. This will be further described below. The cross-coupled transistors 951 and 952 of FIG. 13 provide additional noise immunity for the circuit which also includes the p-keeper in gates 906 and 926. Optionally gates 906 and 926 may include both p-keepers and n-keepers.

Figure 14:
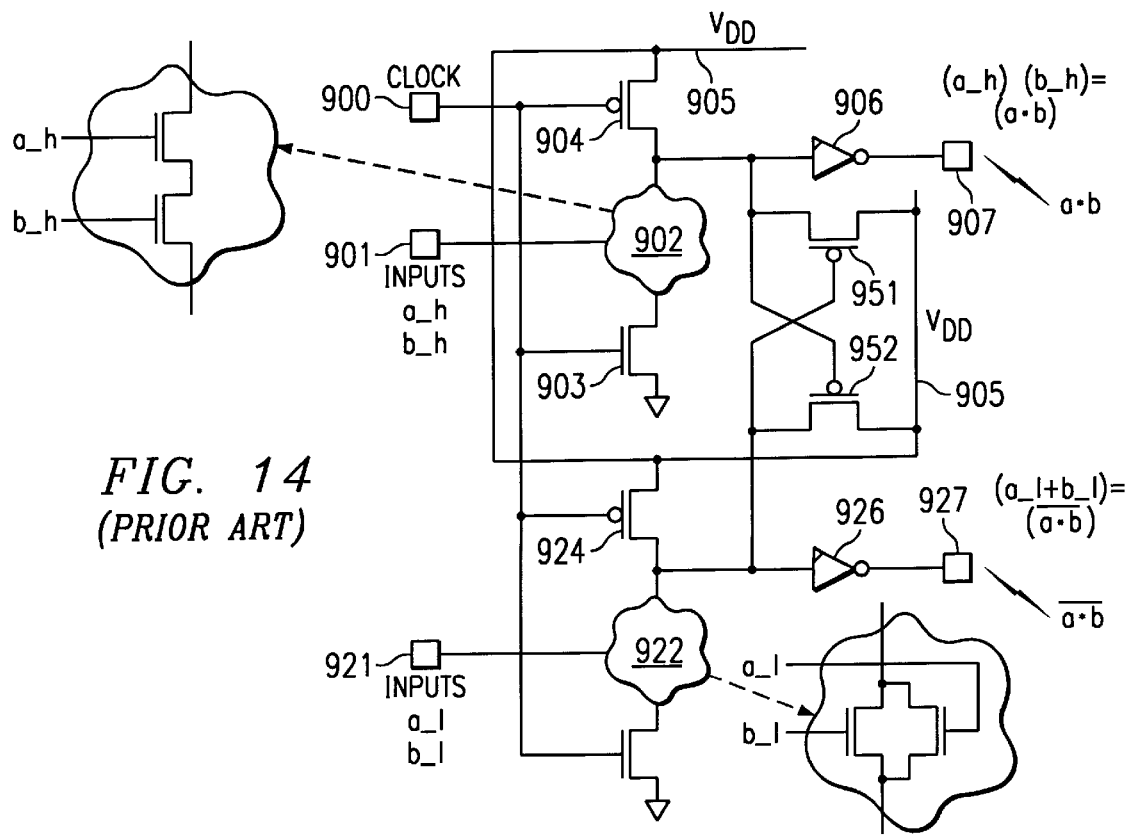
FIG. 14 illustrates an example of the logic implementation of a conventional dual-rail domino logic gate.

FIG. 14 illustrates an example of domino logic for logic circuit block 825 of FIG. 11. The example of FIG. 14 illustrates the logic duals a_h AND b_h in one branch of the output latch producing signal 907, and a_l OR b_l in the other branch of the output latch producing signal 927.

Correct logic behavior is obtained by taking into both logic circuit blocks 902 and 922, signals a_h, a_l, b_h and b_l, and forming the complex duals of the AND and OR functions. The circuit inserts in FIG. 14 show the construction of logic circuit blocks 902 and 922 to perform the logic function a AND b. Those skilled in the art would realize that other logic functions including more complex functions are possible.

The dual-rail output latch configuration of FIGS. 13 and 14 will not work properly if their corresponding inputs 901 and 921 are derived from a single-rail signal into 901 feeding the opposite logic phase into 921 via an inverter. Solving that problem is the heart of this invention.

Figure 15:
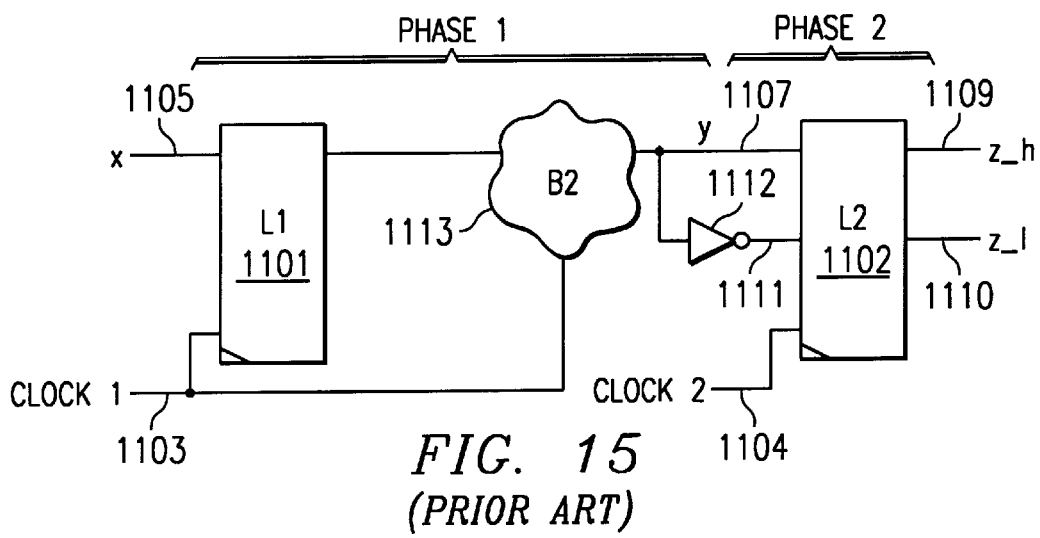
FIG. 15 illustrates a conventional single-rail domino logic gate driving a conventional dual-rail domino logic latch with timing diagrams included illustrating incorrect logic behavior.
Figure 16:
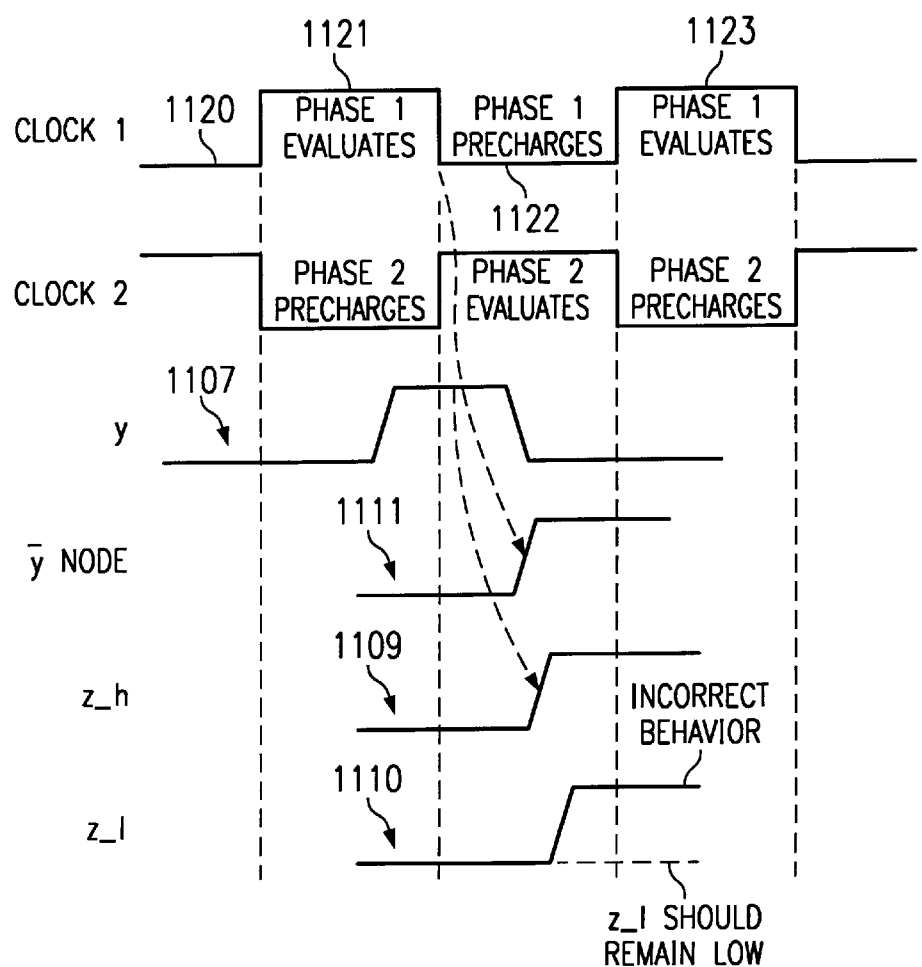
FIG. 16 illustrates the timing of the circuit illustrated in FIG. 15.

FIG. 15 illustrates a single-rail domino logic latch 1101 is driving a latch 1102. A simple conversion of single-rail input "Y" to a dual-rail signal with outputs z_h and z_l is desired. The timing behavior of the circuit of FIG. 15 is illustrated in FIG. 16. This timing behavior is based on the transistor and gate level implementation of latch 1102 illustrated in FIG. 17.

Figure 17:
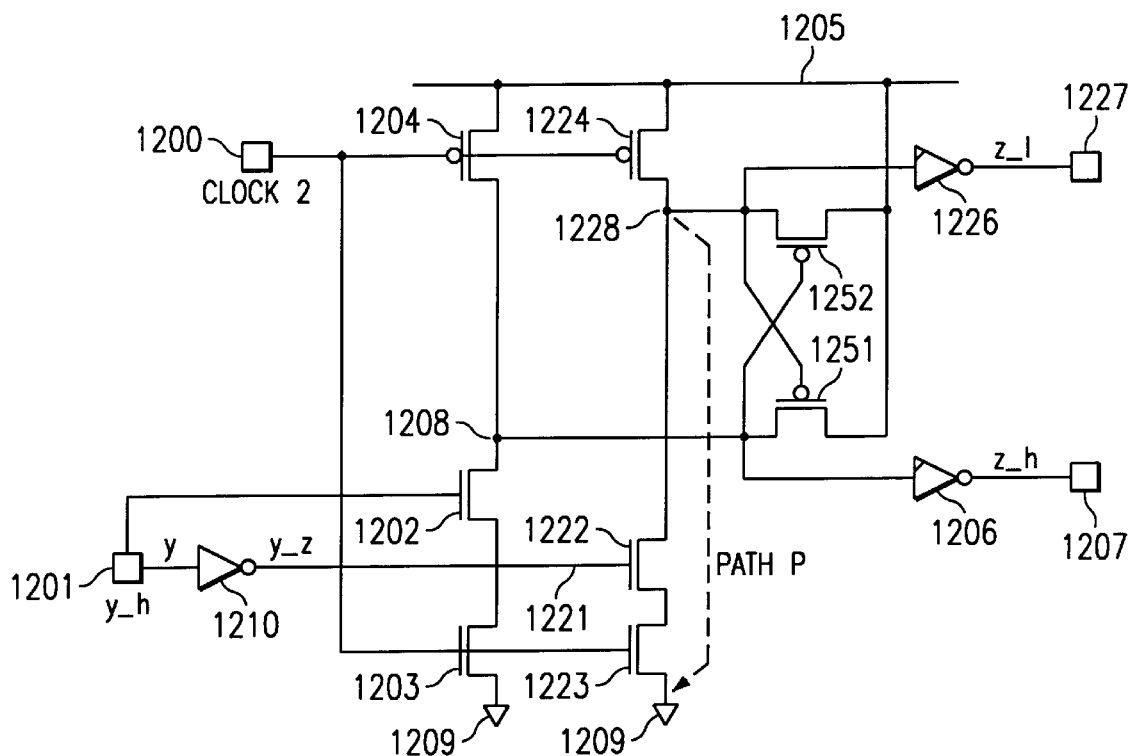
FIG. 17 illustrates the conventional transistor level schematic of the latch of FIG. 15.

FIG. 17 illustrates nothing more than the circuit of FIG. 13 with the logic circuit blocks 902 and 922 replaced with inverter transistors 1202 and 1222 respectively. In addition, the input signals 901 and 921 are replaced by a single-rail input signal 1201 and by placing an inverter 1210 between the corresponding signals 1201 and 1221 of FIG. 17. This is a seemingly straightforward implementation of the L2 block of FIG. 15 function, however it does not function properly. Referring to FIG. 16 for the timing diagrams, during interval 1122 when "Y" precharges "low", "y_z" node 1221, which is merely the inversion of "Y", will go "high". The result is that signal "z_h" attains the proper value "high" because of the path through transistors 1202 and 1203 causes node 1208 to go "low". But the signal z_l will also go "high" because its input in that branch of the dual-rail latch is derived from inversion of the signal "Y" now precharging "low". This action of node 1228 discharging "low" through path "P" of FIG. 17 causes z_l to go "high" giving the incorrect behavior shown in FIG. 16.

A domino logic hold-time latch relies on the input to the gate remaining "high" long enough for the consuming gate to finish evaluation. Since the input to a hold-time latch comes from a dynamic gate, it monotonically falls when the consuming gate is in precharge. Historically, this monotonically falling behavior was required for proper operation of the hold-time latch. However, suppose there was merely an inversion between the input signal and its negation. In this case when the driving gate entered precharge, the input signal could rise causing the consuming gate to evaluate and propagate an incorrect logic value.

This has been an enormous drawback in conventional domino logic requiring dual-rail outputs to be latched. If the consuming gate was dual-rail for logic reasons (an XOR was to be implemented), then this forced the driving gate (and all other logic in that phase) to be dual-rail. Dual-rail gates consume roughly twice the power of single-rail gates and require more chip area. If the designer wanted to use a single-rail logic in the driving latch such as 1101 of FIG. 15, the use of a hold-time latch as a second receiving latch (1102 of FIG. 15) to generate the dual-rail output from the second receiving latch would not be allowed.

DETAILED DESCRIPTION OF PREFERRED EMBODIMENTS

Figure 18:
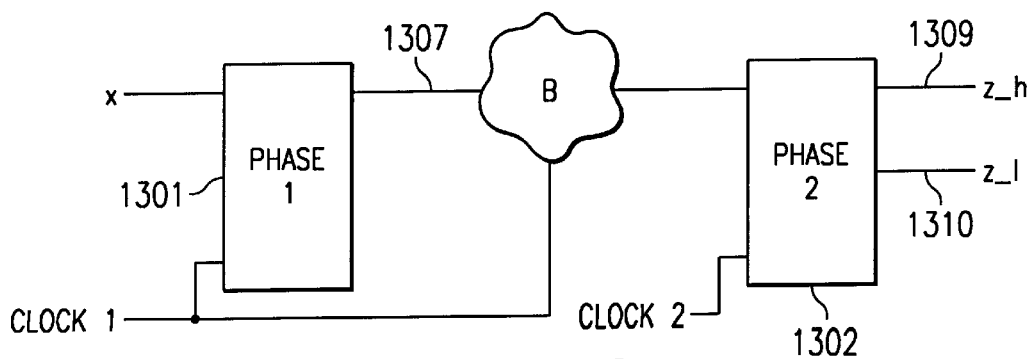
FIG. 18 illustrates a single-rail domino logic gate driving the domino logic hold-time latch of this invention producing a dual-rail output with timing diagrams included illustrating correct logic behavior.
Figure 19:
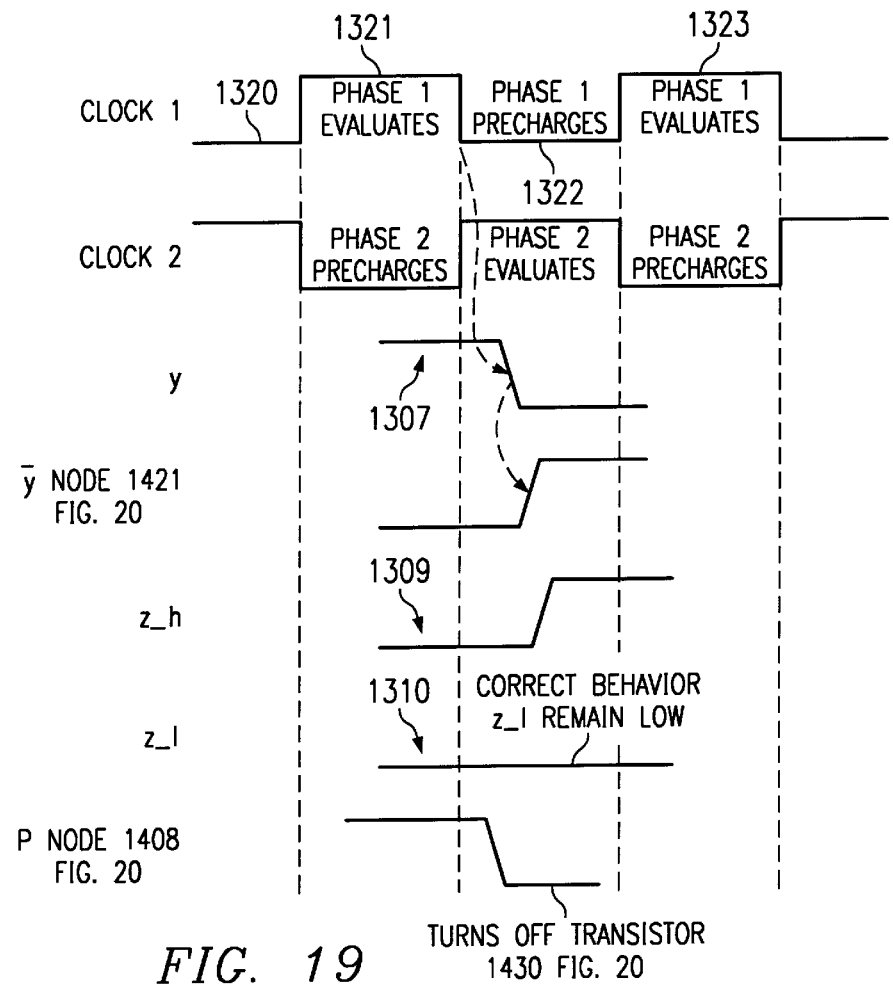
FIG. 19 illustrates the timing of the circuit illustrated in FIG. 18.
Figure 20:
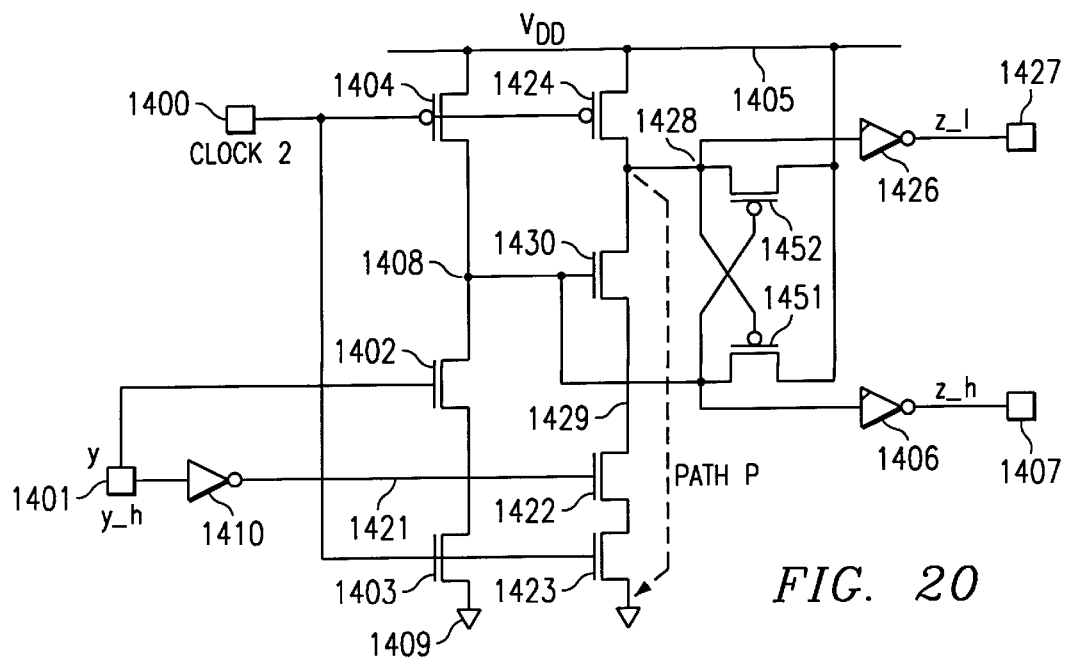
FIG. 20 illustrates the transistor level schematic of the hold-time latch of this invention which produces the correct logical result for a single-rail to dual-rail conversion.

FIG. 18 illustrates a block diagram of this invention. FIG. 19 illustrates the timing of the circuit of FIG. 18. FIG. 20 illustrates a transistor level schematic drawing of hold-time latch L2 of FIG. 18. Together these FIGS. 18 to 20 illustrate the desired behavior of the hold-time latch of this invention. The hold-time latch of this invention is latch L2 (1302 of FIG. 18) which has single-rail input and dual-rail outputs. The crux of the problem solved by this invention is to eliminate the incorrect discharge of node 1428 (FIG. 20) through path P including transistors 1422 and 1423 during the evaluate phase of the receiving latch. This incorrect discharge is prevented by the addition of transistor 1430 whose gate is driven from node 1408.

In contrast to the behavior of the circuit of FIG. 20, the circuit of the present invention prevents the incorrect behavior in hold-time latch L2. FIG. 16 illustrates the signal z_l rising during the time interval 1122. This rise causes incorrect behavior. Transistor 1430 prevents this incorrect behavior. Consider the case where y_h is initially "high" and goes "low" during the evaluate interval 1322. This case is illustrated in FIG. 19. The input signal a_h remains "high" long enough to discharge node 1408 via clocked transistors 1404 and 1403, and transistor 1402. Transistor 1430 is cut off and thus node 1428 does not discharge but remains "high". Accordingly, p-keeper gate 1206 latches the output z_h at output node 1407 "high". The key element in the circuit is the transistor 1430 which receives its gate drive from node 1408 and prevents discharge of node 1428 to ground potential during time interval 1322. Otherwise a conflicting and erroneous signal could occur due to the momentary "on" condition of transistors 1422 and 1423 during time interval 1322.

Figure 21:
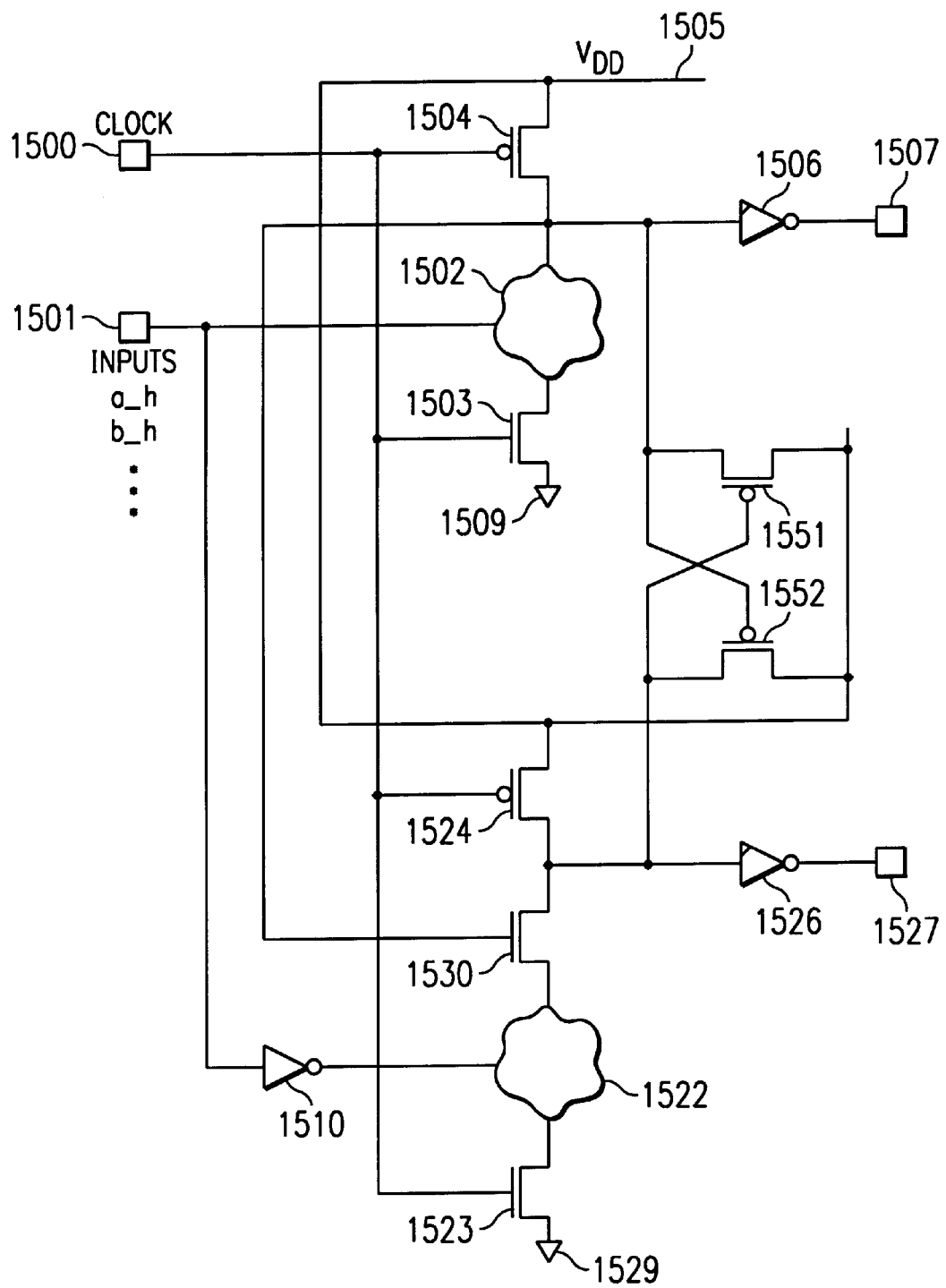
FIG. 21 illustrates an alternative to the circuit illustrated in FIG. 20.

FIG. 21 illustrates a variation of the circuit of FIG. 20 capable of performing an arbitrarily complex logic function. In FIG. 21 the transistors 1402 and 1422 illustrated in FIG. 20 are replaced with logic circuit blocks 1502 and 1522, respectively. This substitution is the reverse of the substitution of particular logic blocks illustrated in FIG. 14 for logic blocks 902 and 922 of FIG. 13. As illustrated schematically at input 1501, the circuit of FIG. 21 may receive plural inputs a_h, b_h, etc. As illustrated in FIG. 14 and previously stated, logic block circuits 1502 and 1522 must be logical complements. Additionally, inverter 1510 is shown schematically. In an actual circuit each of the one or more inputs a_h, b_h, etc. is individually inverted via a corresponding inverter. Transistor 1530 prevents discharge of the input of p-keeper gate 926 during evaluation as previously described with reference to transistor 1430 in FIG. 20.

The present invention provides a simple means of implementing in domino logic the often needed single-rail to dual-rail conversion with hold-time latching action. The addition of transistor 1430, placed in the crucial discharge path P, with its gate driven from node 1408 is the heart of the invention.

What is claimed is:

1. A single-rail to dual-rail logical conversion circuit for domino logic comprising:
    a first P-channel precharge transistor having a source-drain path connected between a supply voltage and a first precharge node and a gate connected to receive a clock signal, said first precharge node being a first output of said single-rail to dual-rail logical conversion circuit;
    a first N-channel logic transistor having a source-drain path connected between said first precharge node and a first intermediate node and a gate connected to receive a single-rail input signal;

a first N-channel discharge transistor having a source-drain path connected between said first intermediate node and ground and a gate connected to receive the clock signal;

an input signal inverter having a input connected to receive the single-rail input signal and an output;

a second P-channel precharge transistor having a source-drain path connected between a supply voltage and a second precharge node and a gate connected to receive the clock signal, said second precharge node being a second output of said single-rail to dual-rail logical conversion circuit;

a second N-channel logic transistor having a source-drain path connected between said second precharge node and a second intermediate node and a gate connected to said first precharge node;

a third N-channel logic transistor having a source-drain path connected between said second intermediate node and a third intermediate node and a gate connected to said output of said inverter; and a second N-channel discharge transistor having a source-drain path connected between said third intermediate node and ground and a gate connected to receive the clock signal.

2. The single-rail to dual-rail logical conversion circuit of claim 1, further comprising:

a first cross coupled P-channel transistor having a source-drain path connected between the power supply and said first precharge node and a gate connected to said second precharge node; and a second cross coupled P-channel transistor having a source-drain path connected between the power supply and said second precharge node and a gate connected to said first precharge node.

3. The single-rail to dual-rail logical conversion circuit of claim 1, further comprising:

a first output inverter having an input connected to said first precharge node and an output forming a first buffered output of said single-rail to dual-rail logical conversion circuit; and a second output inverter having an input connected to said second precharge node and an output forming a second buffered output of said single-rail to dual-rail logical conversion circuit.

4. The single-rail to dual-rail logical conversion circuit of claim 3, further comprising;

a first P-keeper P-channel transistor having a source-drain path connected between the power supply and said first precharge node and a gate connected to said output of said first output inverter; and a second P-keeper P-channel transistor having a source-drain path connected between the power supply and said second precharge node and a gate connected to said output of said second output inverter.

5. The single-rail to dual-rail logical conversion circuit of claim 4, further comprising;

a first N-keeper N-channel transistor having a source-drain path connected between said first precharge node and a fourth intermediate node and a gate connected to said output of said first output inverter;

a third N-channel discharge transistor having a source-drain path connected between said fourth intermediate node and ground and a gate connected to receive the clock signal;

a second N-keeper N-channel transistor having a source-drain path connected between said second precharge node and a fifth intermediate node and a gate connected to said output of said input signal inverter; and a fourth N-channel discharge transistor having a source-drain path connected between said fifth intermediate node and ground and a gate connected to receive the clock signal.

6. A single-rail to dual-rail logical conversion circuit for domino logic receiving at least one single-rail input signal comprising:

a first P-channel precharge transistor having a source-drain path connected between a supply voltage and a first precharge node and a gate connected to receive a clock signal, said first precharge node being a first output of said single-rail to dual-rail logical conversion circuit;

a first logic circuit block connected to said first precharge node and a first intermediate node and having at least one single-rail input node, each single-rail input node receiving a corresponding single-rail input signal, said first logic circuit block conditionally conducting between said first precharge node and said first intermediate node depending upon a logic state of signals received at said least one single-rail input node;

a first N-channel discharge transistor having a source-drain path connected between said first intermediate node and ground and a gate connected to receive the clock signal;

at least one input signal inverter, each input signal inverter having a input connected to receive a corresponding single-rail input signal and an output;

a second P-channel precharge transistor having a source-drain path connected between a supply voltage and a second precharge node and a gate connected to receive the clock signal, said second precharge node being a second output of said single-rail to dual-rail logical conversion circuit;

a second logic circuit block connected to said second precharge node and a second intermediate node and having at least one single-rail input node, each single-rail input node connected to a corresponding input signal inverter, said second logic circuit block conditionally conducting between said second intermediate node and a third intermediate node depending upon a logic state of signals received at said at least one single-rail input node, said condition of said second logic circuit block being a complement of said condition of said first logic circuit block;

a third N-channel logic transistor having a source-drain path connected between said second intermediate node and a third intermediate node and a gate connected to said output of said inverter; and a second N-channel discharge transistor having a source-drain path connected between said third intermediate node and ground and a gate connected to receive the clock signal.

7. The single-rail to dual-rail logical conversion circuit of claim 6, further comprising:

a first cross coupled P-channel transistor having a source-drain path connected between the power supply and said first precharge node and a gate connected to said second precharge node; and a second cross coupled P-channel transistor having a source-drain path connected between the power supply and said second precharge node and a gate connected to said first precharge node.

8. The single-rail to dual-rail logical conversion circuit of claim 6, further comprising:

a first output inverter having an input connected to said first precharge node and an output forming a first buffered output of said single-rail to dual-rail logical conversion circuit; and a second output inverter having an input connected to said second precharge node and an output forming a second buffered output of said single-rail to dual-rail logical conversion circuit.

9. The single-rail to dual-rail logical conversion circuit of claim 8, further comprising;

a first P-keeper P-channel transistor having a source-drain path connected between the power supply and said first precharge node and a gate connected to said output of said first output inverter; and a second P-keeper P-channel transistor having a source-drain path connected between the power supply and said second precharge node and a gate connected to said output of said second output inverter.

10. The single-rail to dual-rail logical conversion circuit of claim 9, further comprising;

a first N-keeper N-channel transistor having a source-drain path connected between said first precharge node and a fourth intermediate node and a gate connected to said output of said first output inverter;

a third N-channel discharge transistor having a source-drain path connected between said fourth intermediate node and ground and a gate connected to receive the clock signal;

a second N-keeper N-channel transistor having a source-drain path connected between said second precharge node and a fifth intermediate node and a gate connected to said output of said input signal inverter; and a fourth N-channel discharge transistor having a source-drain path connected between said fifth intermediate node and ground and a gate connected to receive the clock signal.

\* \* \* \* \*